United States Patent [19]

Travis

[11] 4,453,133
[45] Jun. 5, 1984

[54] ACTIVE PREDISTORTER FOR LINEARITY COMPENSATION

[75] Inventor: George W. Travis, Colts Neck, N.J.

[73] Assignee: Bell Telephone Laboratories, Incorporated, Murray Hill, N.J.

[21] Appl. No.: 365,313

[22] Filed: Apr. 5, 1982

[51] Int. Cl.$^3$ .............................................. H03F 1/26
[52] U.S. Cl. ................... 330/149; 330/151; 328/163
[58] Field of Search .................... 330/75, 84, 149, 151; 328/163; 332/18, 37 R

[56] References Cited

U.S. PATENT DOCUMENTS

| | | | |
|---|---|---|---|
| 3,471,798 | 10/1969 | Seidel | 330/149 |
| 3,725,806 | 4/1973 | Darlington | 330/149 |
| 3,755,754 | 8/1973 | Putz | 330/151 X |
| 3,825,843 | 7/1974 | Felsberg et al. | 328/163 |
| 4,258,328 | 3/1981 | Prevot et al. | 330/149 |

Primary Examiner—James B. Mullins
Assistant Examiner—Steven J. Mottola
Attorney, Agent, or Firm—John Francis Moran

[57] ABSTRACT

A wideband amplifier utilizes predistortion components developed by an amplifying device (14) similar to the power amplifying device (15) to provide effective linearization for substantially reducing all of the intermodulation distortion products. Since the compensation is provided at the input to the power amplifier, the need for an output signal combiner is obviated so that the total power is available at the output. The efficiency is also enhanced since the predistortion amplifier (14) which operates from the input signal ony need be a voltage amplifier. An optional feedback circuit is disclosed which may be employed to reduce nonlinearities further if necessary.

7 Claims, 2 Drawing Figures

ACTIVE PREDISTORTER FOR LINEARITY COMPENSATION

BACKGROUND OF THE INVENTION

This invention relates to linearity compensation used to reduce distortion in amplifiers. More particularly, the invention relates to feedforward techniques in broadband amplifiers employing similar types of amplifying devices.

Various distortion compensation techniques have been devised for improving the performance of amplifiers. Among them are feedforward and feedback. Conventional feedforward arrangements require duplication of power amplifiers, each in a signal path that are combined at the output. The amplifier duplication wastes power while the loss incurred by combining signals at the output reduces the effective output of the amplifier. Feedback, on the other hand, reduces distortion at the expense of gain often requiring further stages of amplification to produce the desired output.

In some applications more than others, such as satellite repeaters, these penalties are serious drawbacks. Of chief concern are compact circuits with low power consumption and minimal weight for use in satellites. Another concern is that the circuits in satellites are typically operated at high levels to obtain high output levels for the total power consumed which unfortunately tends to exacerbate the effect of nonlinearities.

Due to the ever increasing demand in the amount of information to be transmitted, the need for linear amplifiers with wide bandpass characteristics is highly desirable. Currently, transponders operating in designated bands in a satellite repeater are required to prevent intermodulation distortion of multipath interference between received signals being amplified and redirected toward earth stations. Such an approach is costly in terms of the loss of bandwidth efficiency due to the required spacing between designated bands and the weight of the several sections in the filter demultiplexers used in such an approach.

Another linearization technique is known as predistortion compensation wherein predistortion components are added to the input signal to provide destructive interference between the predistortion components and a selected order of the distortion introduced by the amplifier while in the process of amplifying. Conventional arrangements, however, typically utilize passive circuitry (e.g., diode arrangements) in the predistorter which reduces distortion by partially emulating the distortion characteristics of the active amplifier. In effect, a large portion of the input signal is required to provide sufficient signal levels for operating the predistorter before amplification to generate a particular order of distortion components. As a result, the gain or amplification factor is reduced to improve performance for the selected order of distortion.

Although these drawbacks are particularly acute in satellite applications, an amplifier which overcomes such problems will offer attendant advantages that are highly beneficial in a variety of other applications wherein high linearity and wide bandpass characteristics are desirable. For example, typical applications may include microwave radio and single sideband transmission systems.

SUMMARY OF THE INVENTION

Broadly, the invention takes the form of a predistortion compensator employing a voltage amplifier for producing distortion components which are combined in appropriate amplitude and phase relationship with the input signal of a power amplifier to linearize its operation.

In some of the additional aspects of the invention, the voltage amplifier is selected to have similar input-output, delay and phase characteristics as the power amplifier. By taking the difference between a portion of the output and the input of the voltage amplifier, distortion components are produced for adding to the input signal of the power amplifier to achieve linearity compensation. Both amplifiers may take the form, for example, of a traveling wave tube or a field effect transistor.

In some of the further aspects of the invention, an optional feedback loop is utilized to provide an additional reduction in the distortion produced by slight variations between the characteristics of the voltage and power amplifiers. In the loop, the difference between a portion of the output signal and the input signal is also added to the input signal of the power amplifier for correcting its operation. Due to the additional delay of the feedback loop in this variation, broadbanding will be somewhat limited.

BRIEF DESCRIPTION OF THE DRAWING

The above-mentioned and other features and objects of the present invention will become more apparent by reference to the following detailed description taken in conjunction with the accompanying drawing wherein.

DETAILED DESCRIPTION

Figure 1:
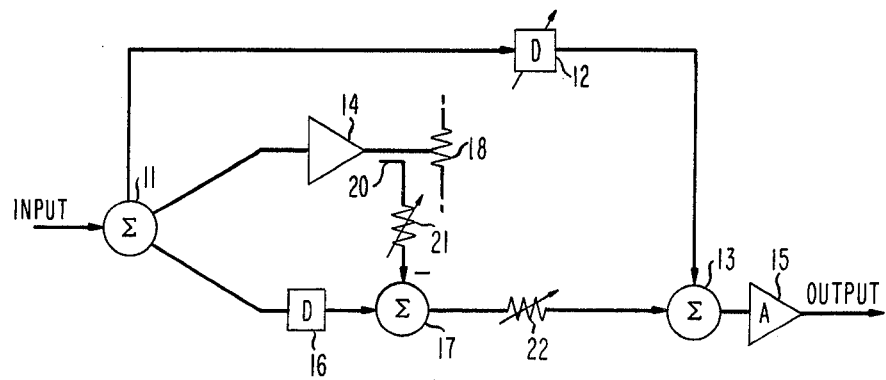
FIG. 1 is a circuit diagram embodying the inventive feedforward compensation technique.

FIG. 1 is a diagram of circuit designed to provide predistortion compensation in accordance with the invention for main power amplifier 15. The input signal is applied to amplifier 15 via signal splitter 11, delay 12 and signal combiner 13. One of the other two components of the input signal from signal splitter 11 drives voltage amplifier 14. The remaining output of signal splitter 11 is retained by delay 16 before application to signal combiner 17. The other input of signal combiner 17 is a portion of the output of amplifier 14 provided by coupler 20 via adjustable attenuator 21. Coupler 21 is impedance terminated by load 18.

The sole purpose of amplifier 14 is to generate the same type of distortion components as produced by the nonlinearity of amplifier 15. Although amplifier 14 is a preamplifier or voltage amplifier, it is selected to have similar transfer characteristics to amplifier 15. Accordingly, the input-output, delay and phase characteristics of the two amplifiers should be similar. Similarly of characteristics of amplifiers is most typically obtained when the same fabricating technique is used in making both devices. Signal combiner 17 takes the difference between a delayed version of the input signal and a portion of the output signal of amplifier 14 which is adjusted to have the same amplitude by using attenuator 21. The output of signal combiner 17 thus produces only the distortion components attributed to the nonlinearity distortion introduced by amplifier 14.

The distortion component output from signal combiner 17 is adjusted in amplitude by attenuator 22. The relative phase between the distortion component and the input signal to signal splitter 11 is adjusted by delay 12. The predistorted input signal of amplifier 15 is produced by the output of signal combiner 13. When the distortion components produced by amplifier 14 are adjusted to have the appropriate phase and amplitude, predistortion compensation is achieved for amplifier 15. Accordingly, as amplifier 15 is increasing its output in response to the amplitude of its primary input signal from delay 12, the presence of predistortion components applied to its input serves to cancel out the distortion components that are normally produced by the nonlinearity of amplifier 15.

As a result, due to this circuit arrangement, the output signal of amplifier 15 is a more faithful reproduction of the input signal applied to signal splitter 11 which is due to correcting the nonlinearity present in amplifier 15. Amplifier 14, which primarily serves as a voltage amplifier, is thus able to correct or linearize the performance of a power output amplifier such as amplifier 15. Accordingly, the circuit dissipates a minimum of power and virtually the full output of amplifier 15 is available for utilization.

It should be noted that it is important for broadbanding that the effective electrical path length from signal splitter 11 to signal combiner 17 via amplifier 14, coupler 20 and attenuator 21 be equal to the electrical path length between signal splitter 11 to combiner 17 via delay 16. Also, the electrical path length from splitter 11 to combiner 17 when added to the electrical path length from combiner 17 to combiner 13 via attenuator 22 should be equal to the electrical path length from signal splitter 11 to combiner 13 via the path of delay 12.

Figure 2:
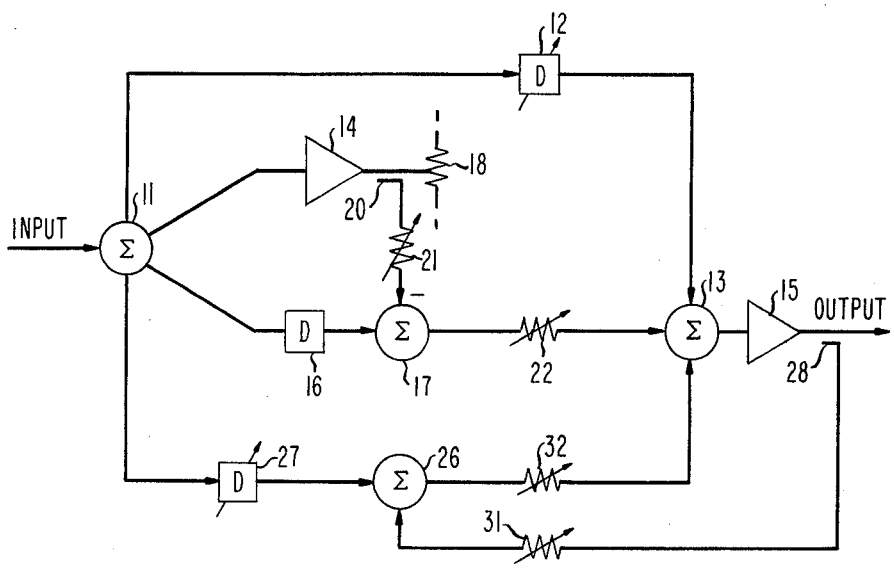
FIG. 2 is also a circuit diagram embodying the invention wherein an optional feedback arrangement is employed.

FIG. 2 employs feedback compensation in addition to predistortion compensation. Like reference numerals in the drawing figures are utilized to identify like electrical components. In FIG. 1, the assumption was made that the preamplifier and power amplifier have similar transfer characteristics which is proper when similarly constructed traveling wave tubes, klystrons, power field effect transistors and the like are utilized. However, the arrangement of FIG. 2 dynamically removes any residual distortion produced by slight differences between the operational characteristics of the low-power voltage amplifier and the high-power amplifier.

One of the differences between FIGS. 1 and 2 resides in that signal splitter 11 provides an additional output. Signal comparator 26 receives this signal via adjustable delay 27 and a portion of the output signal from power amplifier 15. The latter input is obtained from the output of the power amplifier via signal splitter or directional coupler 28 and attenuator 31. The two input signals to comparator 26 are appropriately adjusted to be in amplitude coincidence and 180 degrees out of phase so that distortion is the only output of comparator 26. The distortion is coupled to the input of amplifier 15 through adjustable attenuator 32 and an additional input of signal combiner 13. Since this feedback loop operates from a residual effect due to incomplete cancellation which results in low level feedback signals, the feedback loop may be readily implemented. Accordingly, the components of the feedback loop may not be required to operate over a large dynamic range and the available bandwidth will be sufficient for the frequency content of the signal involved.

Although the invention provides advantages highly desirable for satellite applications, it is again stressed that the benefits accrued will enable those skilled in the art to utilize the invention to advantage in various other applications. Also, modifications of the illustrative embodiments will become apparent to those skilled in the art for practicing the inventive principles. For example, in some applications the operational characteristics of dissimilar devices, such as a klystron and traveling wave tube, may be sufficiently close to yield adequate linearization. Although the embodiments of the invention are illustrated using adjustable components, proper amplitude and phase relationships also may be obtained by judicious selection of circuit components and circuit layout techniques to reduce adjustments and to achieve economy. In all cases, numerous and varied other arrangements may become apparent to those working in the invention.

What is claimed is:

1. An amplifier circuit for an electromagnetic wave signal comprising a power amplifier and an auxiliary amplifier wherein the distortion introduced by the power amplifier is compensated by using the auxiliary amplifier characterized in that the auxiliary amplifier is connected to receive a portion of the electromagnetic wave signal and is a voltage amplifier having similar input-output, delay, and phase characteristics to the power amplifier, means for combining the output of the auxiliary amplifier and a portion of the electromagnetic wave signal in phase opposition relationship to produce an output of distortion components substantially free of the presence of the electromagnetic wave signal, and means for adjusting the electrical path length traversed by the electromagnetic wave signal before being applied to the input of the power amplifier, and means for combining the distortion components and the electromagnetic wave signal to provide predistortion compensation for improving the linearity of the amplifier circuit.

2. An amplifier in accordance with claim 1, wherein said power amplifier and said auxiliary amplifier comprises the same kind of amplifying devices.

3. An amplifier in accordance with claim 2 further comprising attenuating means connected to receive the distortion components for adjusting their amplitude to effect linearization of the operating characteristic of said power amplifier.

4. An amplifier in accordance with claim 3 wherein said power amplifier and said auxiliary amplifiers both comprise field effect transistor amplifying devices.

5. An amplifier in accordance with claim 3 wherein said power amplifier and said auxiliary amplifier both comprise traveling wave tube amplifying devices.

6. An amplifier in accordance with claim 2 further comprising a second signal combiner connected to receive a portion of the electromagnetic wave signal and a portion of the output signal of said main amplifier for producing a feedback signal for the input of said power amplifier for providing further linearization of its operational characteristic.

7. An amplifier in accordance with claim 6 wherein connected in circuit with the second signal combiner are attenuating means and phase shifting means for providing a portion of the output signal from the power amplifier indicative of its nonlinearity appropriately adjusted in amplitude and phase to enhance further the linearization of the amplifier.

* * * * *